US012782481B2

(12) United States Patent
Biber

(10) Patent No.: US 12,782,481 B2
(45) Date of Patent: Nov. 3, 2026

(54) ARRANGEMENT WITH A BODY COIL AND A GRADIENT COIL FOR A MAGNETIC RESONANCE SYSTEM, AND MAGNETIC RESONANCE SYSTEM

(71) Applicant: Siemens Healthineers AG, Forchheim (DE)

(72) Inventor: Stephan Biber, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 153 days.

(21) Appl. No.: 18/810,746

(22) Filed: Aug. 21, 2024

(65) Prior Publication Data

US 2025/0076430 A1 Mar. 6, 2025

(30) Foreign Application Priority Data

Sep. 1, 2023 (DE) ..................... 10 2023 208 460.0

(51) Int. Cl.
*G01R 33/385* (2006.01)
*G01R 33/421* (2006.01)

(52) U.S. Cl.
CPC ..... *G01R 33/3854* (2013.01); *G01R 33/4215* (2013.01)

(58) Field of Classification Search
CPC .......................... G01R 33/354; G01R 33/4215
See application file for complete search history.

(56) References Cited

U.S. PATENT DOCUMENTS

| | | | | | |
|---|---|---|---|---|---|
| 6,538,439 | B1 | 3/2003 | Ham | | |
| 6,909,283 | B2 * | 6/2005 | Emeric | G01R 33/3856 | 324/306 |
| 10,120,046 | B2 * | 11/2018 | Takamori | A61B 5/055 | |
| 2012/0025829 | A1 * | 2/2012 | Khalidi | G01R 33/3854 | 324/318 |
| 2013/0043870 | A1 * | 2/2013 | de Lima | G01R 33/34007 | 324/318 |

OTHER PUBLICATIONS

Edelstein W., "Making MRI Quieter," Magnetic Resonance Imaging, (2002) vol. 2, pp. 155-163.
Katsunuma, A., et al., "Quiet MRI with novel acoustic noise reduction," Magnetic Resonance Materials in Physics, Biology and Medicine, (2002), vol. 13, pp. 139-144.
"Questions and Answers in MRI: Birdcage Coils," Veröffentlichungsdatum: Apr. 6, 2019; Quelle (URL: https://web.archive.org/web/20190604112924/https://mriquestions.com/birdcage-coil.html), pp. 1-2.

* cited by examiner

*Primary Examiner* — Gregory H Curran
(74) *Attorney, Agent, or Firm* — Lempia Summerfield Katz LLC

(57) ABSTRACT

An arrangement is provided with a body coil and a gradient coil for a magnetic resonance system. The arrangement includes a cylindrical carrier element on which the body coil is arranged. The body coil and the gradient coil are configured to be arranged spaced from one another. An intermediate space extends between the body coil and the gradient coil. Additionally, at least one subregion of the intermediate space is evacuated. A magnetic resonance system including such an arrangement is also provided.

19 Claims, 3 Drawing Sheets

ARRANGEMENT WITH A BODY COIL AND A GRADIENT COIL FOR A MAGNETIC RESONANCE SYSTEM, AND MAGNETIC RESONANCE SYSTEM

The present patent document claims the benefit of German Patent Application No. 10 2023 208 460.0, filed Sep. 1, 2023, which is hereby incorporated by reference in its entirety.

TECHNICAL FIELD

The disclosure relates to an arrangement with a body coil and a gradient coil for a magnetic resonance system. The arrangement has a cylindrical carrier element on which the body coil is arranged, wherein the body coil and the gradient coil are arranged spaced from one another and an intermediate space extends between the body coil and the gradient coil. The disclosure also relates to a magnetic resonance system with an imaging modality.

BACKGROUND

Modern MRT systems have gradient systems with large field strengths (mT/m) and rapid switching (or slew) rates (SR) (T/m/s). The current for the gradient coil of the gradient system flows in the strong static field of the main field magnet. On dynamic excitation of the gradient coil, the Lorentz forces resulting therefrom generate mechanical oscillations of the coil which propagate via a range of different propagation routes such as airborne sound and/or solid-borne sound by way of the body coil, as far as the patient in the examination space or to the user in front of the scanner. Maximum values of noise in the investigation space, that is, in the "bore" may be in a range of 100 to 120 DCL and thus in the range that (without further ear protection) may lead to a lasting reduction in auditory capacity.

It has therefore long been a goal to design MRT systems acoustically to be as quiet as possible. In particular, the noise level for the patient who has to spend a relatively long time in the MRT system and who experiences the high noise level as negative or annoying, is of great significance for a trouble-free investigation. One of the most important propagation routes for sound in MRT systems is the transfer of oscillations from the gradient coil (GC) to the narrow air gap between the gradient coil and the body coil and then from the support tube of the body coil to the air, toward the patient. This, in particular, is the dominant propagation route.

Strong currents in the body coil lead at particular points, in particular at the capacitors of the body coil, but eventually also between the body coil and the screening, to large HF fields. These may lead to flash-overs, in particular arcing. These flash-overs, if very weak, may lead only to image disturbances, although the flash-overs may be strong and lead to burning away and/or to charring and thus to a defect in the relevant components. Furthermore, the excitation of the body coil may lead to oscillations so that, apart from the transference of oscillations via airborne sound from the gradient coil, it may also take place via the excitation of eddy currents in the conductors of the body coil, which then experience Lorentz forces and excite the support tube of the body coil itself into oscillation.

These disadvantages occur during an operation of an MRT system at high power levels.

SUMMARY AND DESCRIPTION

It is an object of the present disclosure to reduce electric flash-overs and/or a sound transference between the body coil and the gradient coil of an MRT system so that, in particular, an acoustically optimized MRT system may be provided.

This object is achieved by way of an arrangement and an MRT system as described herein. The scope of the present disclosure is defined solely by the appended claims and is not affected to any degree by the statements within this summary. The present embodiments may obviate one or more of the drawbacks or limitations in the related art One aspect of the disclosure relates to an arrangement with a body coil and a gradient coil for a magnetic resonance system with a cylindrical carrier element on which the body coil is arranged, wherein the body coil and the gradient coil are arranged spaced from one another, wherein an intermediate space extends between the body coil and the gradient coil, and wherein at least one subregion of the intermediate space is evacuated.

With the arrangement according to the disclosure, a body coil-gradient coil arrangement may be provided for a magnetic resonance system (MRT system) that may improve acoustic properties of an MRT system. By way of the at least one subregion of the intermediate space that is evacuated and therefore has a vacuum, a sound propagation within the intermediate space between the body coil and the gradient coil may be minimized and/or reduced. By way of the evacuated subregion of the intermediate space, arcing between the gradient coil and the body coil may also be reduced, in particular prevented. By way of the evacuated subregion, the sound propagation between the body coil and the gradient coil may be reduced.

Thus, when the arrangement is used in an MRT system, investigations on a patient may be carried out in a noise-minimizing manner, so that damage to an auditory capacity of the patient or to an operating person of the MRT system may be reduced and/or minimized.

In particular, with the arrangement, the disadvantages mentioned in the introduction may be resolved.

The body coil and the gradient coil may be cylindrical and therefore have a cylindrical form. In particular, the body coil may be inserted concentrically into an interior space of the gradient coil. In other words, the gradient coil surrounds the body coil. In other words, the body coil and the gradient coil may have the form of a tube, wherein the gradient coil has a larger diameter in order to be able to accommodate the body coil in its interior space.

The carrier element, which is cylindrical like the body coil and the gradient coil, may be a support tube of the body coil. Expressed differently, the body coil may be arranged on the surface of the support element so that, for example, the body coil is wound around the support element, which may be tubular. The body coil is, in particular, inserted into the gradient coil such that an outer wall of the body coil is arranged spaced from an inner side of the gradient coil and therefore an air gap exists. This is, in particular, the intermediate space that, when considering a tubular designed body coil in the gradient coil, is also cylindrical in form and, in particular is situated concentrically between the coils. With a concentric insertion of the body coil into the interior region of the gradient coil, when viewed, in particular, in the circumferential direction, the intermediate space exists between the body coil and the gradient coil.

In particular, the at least one subregion of the intermediate space may have a vacuum in order to hinder, (e.g., to reduce), sound propagation between the gradient coil and the body coil. It is also conceivable that the subregion is the entire intermediate space. It is therefore also conceivable that the entire intermediate space is evacuated and thus the intermediate space itself has a vacuum.

In particular, with the proposed arrangement, a construction with a gradient coil and a body coil is provided. Herein, at least the space and/or the intermediate space between the body coil and, in particular, the support element and the gradient coil is evacuated. In particular, for example, a further subregion of the intermediate space, or the intermediate space itself, may have a very low air pressure as compared with an ambient pressure, in order to be able to hinder sound propagation.

In one embodiment, the arrangement has at least one vacuum pump unit with which the subregion may be evacuated, wherein the vacuum pump unit is configured to maintain a vacuum established in the subregion. By the electrical, electronic, or electromechanical vacuum pump unit and/or vacuum generating unit, at least the subregion or the entire intermediate space may be evacuated. Herein, the vacuum pump unit may accordingly be connected via hose connections or pipe connections to the at least one subregion or to the intermediate space in order to be able to carry out a suitable evacuation. Herein, the vacuum pump unit may be configured such that the vacuum pump unit automatically provides that the vacuum established in the subregion may be permanently and/or continuously maintained.

In one embodiment, at least one pressure sensor is arranged in the subregion, whereby the vacuum pump unit is configured to be controlled based on measurement data from the pressure sensor. In the at least one subregion or in the intermediate region as such, at least one pressure sensor or a plurality of pressure sensors may be arranged in distributed manner in order to be able to monitor and/or check the respectively prevailing air pressure. Thus, it may be established whether or not a vacuum exists at least in the subregion or in other subregions of the intermediate space. If, however, the vacuum were only partially present or were no longer present, then with the aid of the measurement data, a control signal appropriate to the pressure sensor may be sent automatically to the vacuum pump unit in order to be able again to carry out a maintenance of the vacuum.

Additionally, or alternatively, the subregion and, in particular, the intermediate space may have openings, by which the vacuum pump unit may be connected to the subregion. Thus, via the openings, corresponding hoses or pipes or other connecting elements may be arranged from the pump unit to the subregion in order to be able to evacuate the subregion or the intermediate space.

For example, the vacuum pump unit may be a vacuum pump that is able to maintain the negative pressure in the subregion or in the intermediate space itself, in that it runs permanently or is controlled, switched on, switched off, and/or regulated by the pressure sensor.

When the body coil and the gradient coil are constructed, the body coil and the gradient coil may be connected to one another non-releasably, but in mechanically yielding manner, that is, such that a slight sound transmission is possible and that the air gap and/or the intermediate space therebetween is accessible by way of one or more openings. Herein, for example, the vacuum, once generated in the subregion may be fixedly maintained and, in particular, in the event of servicing or a fault, may be renewed by connecting the vacuum pump unit.

In one embodiment, the subregion and, in particular the intermediate space are sealed by one or more sealing elements. By this, for example, sealing lips may be arranged at corresponding sites and/or positions on the subregion or the intermediate space as sealing elements. In this way, the vacuum created in the subregion or in an intermediate space itself be may maintained.

In one embodiment, a surface of an outside of the carrier element that is oriented toward the gradient coil is coated at least partially with a special coating which has an electrically insulating property. The body coil that is properly arranged within the gradient coil therefore has a surface and, in particular, the surface of the carrier element which is oriented toward the inside of the gradient coil. Therefore, the surface of the carrier element and, in particular, of the body coil that is oriented toward the gradient coil and thus adjoins the gradient coil at a spacing is therefore coated. In other words, the surface of the outside of the carrier element may have an at least partial coating. In particular, the entire surface may be coated with the special coating. Thus a special coating layer which may have a thickness and/or coating layer thickness in a range of 0.05 mm and 2 mm may be arranged on the surface. This coating may be applied to electrically critical regions on the surface of the carrier element. Thus, an electrical insulation effect of the carrier element and, in particular, of the body coil may be enhanced so that voltage flash-overs and/or arcing between the body coil and the gradient coil or between the body coil and other components or between the body coil and other components may be prevented and/or reduced.

Additionally, or alternatively, a surface of an inside of the gradient coil that is oriented toward the body coil is coated at least partially with a special coating that has an electrically insulating property. Thus, herein in a similar manner as already described in relation to the body coil, the region of the gradient coil that directly adjoins the body coil at a spacing and is thus oriented toward the body coil and, in particular, toward the carrier element may be additionally insulated. With a proper concentric insertion of the body coil into the gradient coil, the outside of the carrier element adjoins the inside of the gradient coil at a spacing. The special coating relating to the gradient coil and the special coating relating to the carrier element of the body coil may be identical or different.

With the specially applied coating, regions at which large voltage gradients may occur may be better separated or insulated from one another. Thus, the arrangement may be configured such that no, in particular minimal, flash-overs may occur at structures with large E-fields. Expressed in other words, with the aid of the specially applied coating, an additional insulation may be provided.

The coating may be applied manually or in a coating process, that is, in an automated manner.

In one embodiment, electrical components of the body coil that are arranged on the carrier element are electrically insulated by protective sleeves and/or electrical components of the gradient coil are electrically insulated by protective sleeves. Thereby, in particular, points with large voltage gradients may be better separated from one another. In this way, in particular, the electrical property of the arrangement may be increased since flash-overs between components in relation to the body coil and the gradient coil may be prevented and/or reduced. The protective sleeves may be protective caps that are applied and/or mounted at critical sites, in particular at the electrical components. For example, in the case of the electrical components such as the body coil and the gradient coil, these may be electronic parts, for example, a capacitor. Thus, this protective sleeve may be applied round the capacitor as an electrical component in order to provide a better electrical insulation.

In one embodiment, regions between electric terminals of at least one electrical component of the electrical components of the body coil are equipped with electrically insulating elements. Thus, for example, at least one electrically insulating element as an electrically insulating barrier may be applied, for example, between solder terminals and/or electrical terminals. Thus, arcing or other voltage flash-overs between these solder terminals such as, in particular, the electrical terminals may be prevented. Additionally, or alternatively, in a similar manner, regions between electric terminals of an electrical component of the electrical components of the gradient coil are equipped with electrically insulating elements and therefore are insulated.

In one embodiment, at least one antenna element of the body coil is at least partially surrounded by an electrically insulated protective film, and in particular the protective film is configured as a shrink film. In other words, a mounting of an insulating layer on the "body coil antenna" or the antenna element of the body coil in the form of a film may be undertaken. In other words, seen in the circumferential direction of the body coil, the antenna element may be at least partially, optionally completely, enveloped and/or enclosed by the insulating protective film. Thus, the antenna element may be correspondingly well electrically insulated so that here also, electrical flash-overs may be prevented.

In a similar manner, an antenna element of the gradient coil may be at least partially surrounded by an electrically insulating protective sleeve. Herein, in particular, the protective film may also be configured as a shrink film.

The protective film that has an insulating effect may be realized as a shrink film so that, after the mounting in a winding process of the antenna elements, the shrink film may be formed better onto the surface of the antenna element. In certain examples, by large-area or local heating of the film, the shrink film may be closely fitted onto the respective antenna element. In this way, a high level of electrical insulation and/or insulation effect may be produced.

In one embodiment, an, in particular cylindrical, screening element is arranged on an inside of the gradient coil which is oriented toward the body coil. Thus, an additional electromagnetic screening may be applied, in particular, to the inside of the gradient coil that is oriented toward the outside of the body coil and/or the carrier element, in order to be able to provide an additional screening between the body coil and the gradient coil. The screening element may be an HF screen, in order to be able to screen HF fields. The HF screen may be an RF shield. By way of the possibilities mentioned above and/or the electrical additional insulation on the gradient coil side and/or on the side of the gradient coil, voltage flash-overs to the screening may be prevented.

In one alternative, the screening element is already integrated in the inside of the gradient coil. Thus, the entire HF screen and/or the complete screening element, in particular, including possible bridging capacitors may be applied not on the outermost surface of the gradient coil, which is open to the air, but rather may be worked with a thin covering layer directly into the gradient coil and therein into the inside itself and/or poured into the inside itself. Thus, a better corresponding HF (high frequency) screening may be provided and/or obtained.

In one embodiment, an additional layer with which voltage flash-overs between the body coil and the gradient coil may be prevented is arranged between the body coil and the gradient coil. This additional layer may be a cylindrical configuration that may have a thickness in a range of 0.1 mm and 5 mm. In particular, this additional layer may be a tubular element, that is, a tube that is introduced between the gradient coil and the body coil in the intermediate space. By this, voltage flash-overs between the body coil and the HF screen on the gradient coil may be prevented.

In particular, the construction of the body coil and, in particular, of the gradient coil may be realized such that small areas of the electrical structures exist in order to prevent eddy currents of the gradient field on the antenna element of the body coil and vibrations resulting therefrom.

In one embodiment, electrical conductor structures of the body coil are mechanically fastened indirectly on the carrier element. Since in the case of a direct mounting of electrical conductor structures such as electrical components of the body coil, vibrations, oscillations, or other negative properties may be transferred directly to the carrier element and thereby to the body coil, the electrical conductor structures may not be mechanically fastened directly onto the carrier element in order to be able, in particular, to prevent and/or reduce sound propagations and, in particular, vibrations. The mechanical application of the electrical conductor structures onto the body coil on the support tube and/or the carrier element is correspondingly executed to be mechanically soft so that the oscillations that are generated on the antenna element and/or the antenna of the body coil by the eddy currents are not transferred directly to the support tube and thereby the support tube itself is not excited into vibrations. In particular, the body coil itself may be constructed such that the antenna structures generate as little vibration as possible with respect to the antenna elements of the body coil itself due to eddy currents of the gradient coil in the conductor and/or the conductor structure of the body coil. For this purpose, with regard to the conductor structures, thin copper layers and/or conductor tracks may be used. Furthermore, large areas may be avoided. Similarly, slits in areas and bridging of capacitors may be avoided. In this way, the acoustic properties of the body coil and thereby of the arrangement and, in particular, of the MRT system may be improved.

In one embodiment, the electrical conductor structures are mechanically fastened on a flexible carrier layer and the flexible carrier layer is fastened on the carrier element. Thus the electrical conductor structure is indirectly connected via the flexible carrier layer to the carrier element.

The electrical conductor structures may be configured as copper layers and/or conductor tracks with a thickness in a range of 5 μm and 100 μm. In particular, the electrical conductor structures may be formed from copper.

The carrier layer may be a thin and mechanically flexible carrier. Thus, with the aid of the carrier layer, oscillations or vibrations from the conductor structure to the carrier element may be prevented and/or reduced.

In one embodiment, the carrier layer is made of a composite material and arranged on one side of the carrier layer, which is directly connected to the carrier element, is a plastics layer, a rubber layer, or a foam material layer. Thus, the carrier layer may be soft and, in particular, applied mechanically decoupled on the carrier layer and/or the support tube. Thus, in particular, the electrical conductor structures are applied in a particularly vibration-minimizing and sound propagation-minimizing manner on the support tube.

For example, the carrier layer may be made from a barely combustible and flame-retardant composite material such as, for example, "FR4." The side of the carrier layer which therefore adjoins the carrier element and may thus be designated the underside of the carrier layer, which is, in particular, opposingly arranged relative to the electrical conductor structures, may be configured from a soft plastics material, a foam material, a rubber, or other easily compressible and deformable plastics material, (e.g., soft plastics, soft PVC, or polyolefins).

The carrier layer may have a thickness in a range of 0.1 mm and 15 mm or in a range of 0.5 mm and 5 mm.

In one embodiment, the body coil and the gradient coil are produced in a common production process such that they are non-releasably mechanically connected to one another and form the intermediate space. Thus, in a production method and/or in a process act, the gradient coil and the body coil may be produced simultaneously and they may be connected to one another accordingly. In other words, herein the body coil is inserted concentrically into the interior region of the gradient coil. The body coil may be connected to the gradient coil by way of particular mechanical connecting points. In particular, the body coil may be mounted within the gradient coil. The intermediate space and/or the air gap is accordingly formed between the gradient coil and the body coil.

In particular, with the aid of the arrangement, a construction of a body coil with a gradient coil may be realized, whereby an evacuated layer, that is the intermediate space, exists between the body coil and the gradient coil in order to provide improved acoustic properties for the MRT system and to resolve problems of voltage flash-overs due to high HF voltages on the body coil.

A further aspect of the disclosure relates to a magnetic resonance system having an imaging modality and an arrangement according to the previous aspect or an advantageous development.

Accordingly, the magnetic resonance system includes the body coil and the gradient coil which are configured accordingly with the arrangement described above.

A magnetic resonance system and/or a magnetic resonance tomography device serves for the investigation of objects or patients by magnetic resonance tomography.

Independent of the grammatical term usage, individuals with male, female or other gender identities are included within the term.

The disclosure also includes developments of the magnetic resonance system as already described in relation to the developments of the arrangement. For this reason, the corresponding developments of the magnetic resonance system are not described again here.

Embodiments of one aspect are to be regarded as advantageous embodiments of the other aspect and vice versa.

The disclosure also includes the combinations of the features of the embodiments described.

In the embodiments described herein, the described components each represent individual features of the disclosure that are to be regarded as independent of one another and each also further develop the disclosure independently of one another and are thus also to be considered individually, or in a combination different from that shown, as a constituent of the disclosure. Furthermore, the embodiments described may also be enhanced with others of the previously described features of the disclosure.

BRIEF DESCRIPTION OF THE DRAWINGS

The present disclosure is now described in greater detail making reference to the accompanying drawings, in which.

In the figures, the same or functionally equivalent elements are provided with the same reference signs.

DETAILED DESCRIPTION

Figure 1:
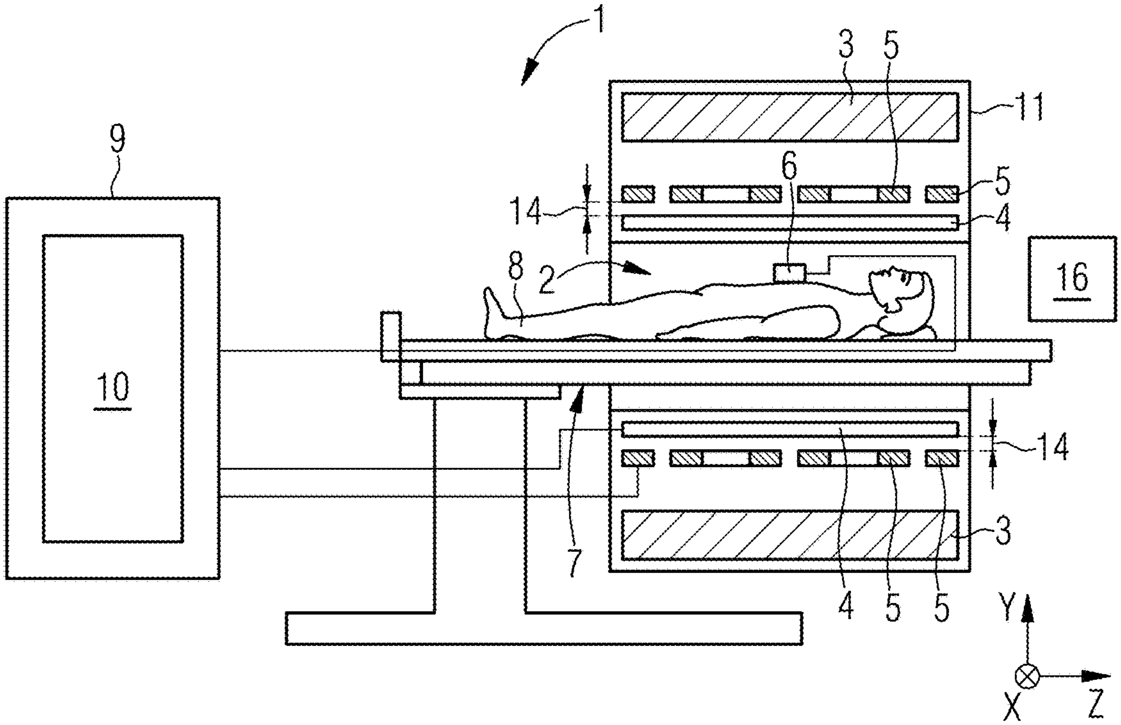
FIG. 1 depicts a schematic view of an example of a magnetic resonance system.

FIG. 1 shows a schematic representation of an embodiment of an MRT system 1 according to the disclosure (also called the magnetic resonance system).

The MRT system 1 includes a magnet unit with a field magnet 3 that generates a static magnetic field for orienting nuclear spins of an object 8, (e.g., a patient), in an imaging region. The imaging region is characterized by an extremely homogeneous static magnetic field, wherein the homogeneity relates, in particular, to the magnetic field strength and/or its amplitude. The imaging region is situated in a patient tunnel 2 that extends in a longitudinal direction Z through the magnet unit. The field magnet 3 may be a superconducting magnet that may generate magnetic fields with a magnetic flux density of up to 3 T or more. For lower field strengths, however, permanent magnets or electromagnets with normally-conducting coils may also be used. A patient table 7 and/or examination table may be capable of movement within the patient tunnel 2.

Furthermore, the magnet unit includes at least one gradient coil 5. It is also conceivable that the gradient coil 5 includes an arrangement of a plurality of gradient subcoils. The gradient coil 5 serves to overlay gradient fields, that is position-dependent magnetic fields, on the static magnetic field in the three spatial directions for spatial differentiation of the scanned image regions in the imaging region. The gradient coil 5 may be configured as a coil of normally-conducting wires that may generate fields or field gradients orthogonally to one another in the imaging region.

The magnet unit includes a transmitting coil arrangement that may include a body coil 4 (also referred to as a whole body coil) as the transmitting antenna, which is configured to radiate a high frequency signal and/or an excitation signal into the imaging region. The body coil 4 may therefore be understood to be an HF transmitting coil arrangement of the MRT system 1 or as part of the HF transmitting coil arrangement. The body coil 4 may also be used in some embodiments to receive resonant MR signals which are emitted by the object 8. In this case, the body coil 4 may also be considered to be part of a signal acquisition apparatus of the MRT system 1. Optionally, the signal acquisition apparatus includes a local coil 6 which may be arranged in the immediate vicinity of the object 8, for example, on the object 8 or in the patient table 7. The local coil 6 may serve, alternatively or in addition to the body coil 4, as a receiving coil and/or a receiving antenna.

The MRT system 1 also includes a control and computing system 9. The control and computing system 9 may include a transmitting-receiving control unit 10 which is connected to the body coil 4, the gradient coil 5, and/or the local coil 6. Dependent upon the acquired MR signals, the transmitting-receiving control unit 10, which may include an analogue-to-digital converter (ADC), may generate corresponding MR data, in particular, in the k-space. The transmitting-receiving control unit 10 is possibly also connected to the body coil 4 and controls it to generate HF pulses such as excitation pulses and/or refocusing pulses. Furthermore, the transmitting-receiving control unit 10 of the control and computing system 9 may also be connected to the gradient coil 5 and control it in order to switch slice selection gradients, gradients for the frequency and/or phase encoding and/or readout gradients.

For example, the MRT system 1 has an imaging modality 11. The imaging modality 11 may have at least the magnet unit, the patient table 7, and the patient tunnel 2.

Figure 2:
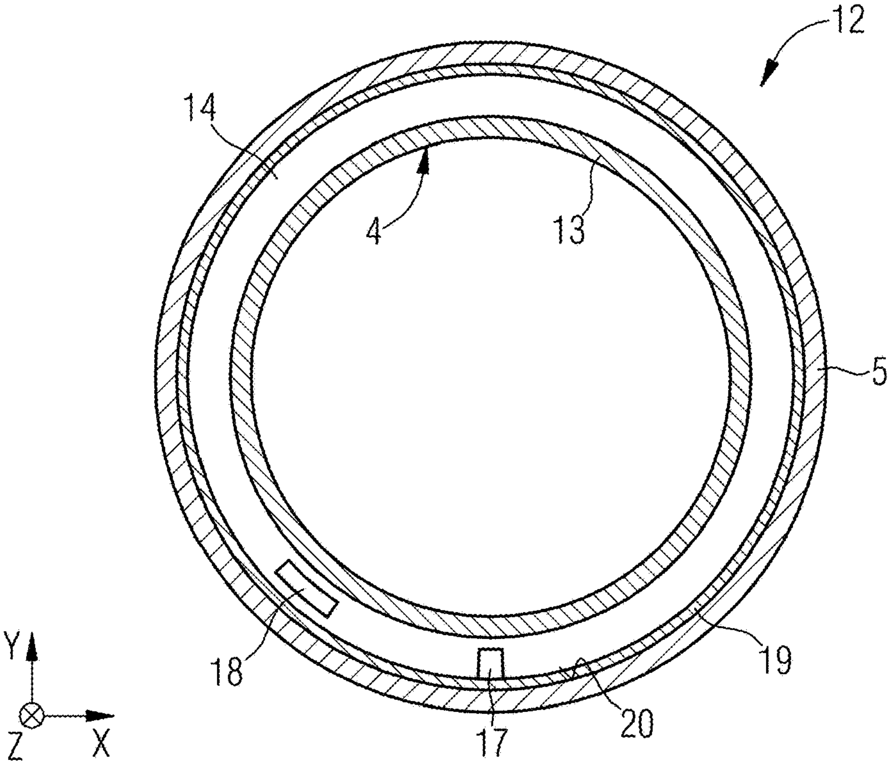
FIG. 2 depicts an exemplary sectional view of an arrangement with a body coil and a gradient coil of the MRT system of FIG. 1.

FIG. 2 shows an exemplary arrangement 12 of the body coil 4 and the gradient coil 5. It is, in particular, a sectional representation that is shown here.

The body coil 4 and the gradient coil 5 may have a cylindrical form and may be configured pictorially speaking as, for example, a "tube." As shown here by way of example, a diameter of the body coil 4 may be smaller than a diameter of the gradient coil 5, so that the body coil 4 and, in particular, the unit relating to the body coil 4 may be introduced and/or inserted and/or included concentrically into an interior region and/or an interior space of the gradient coil 5 and/or a unit of the gradient coil 5. For this purpose, in FIG. 2 in the exemplary sectional representation, it is shown how the individual components of the arrangement 12 have a tubular, circular, or cylindrical form. In particular, the body coil 4 and the gradient coil 5 may be configured as hollow cylinders. In other words, they may be "hollow tubes."

The body coil 4 may be carried and/or received by a cylindrical carrier element 13, also designated a support tube and/or BC support tube. Components of the body coil 4, in particular, antenna elements such as transmitting antennae, may be arranged on this support element 13. As may also be seen, the body coil 4 may be inserted into the gradient coil 5 such that the body coil 4 and the gradient coil 5 are arranged spaced from one another. Thus, an intermediate space 14 extends between the body coil 4 and the gradient coil 5. This intermediate space 14 extends in the circumferential direction as viewed in an extension in the z-direction of the coils 4, 5.

For example, the body coil 4 and the gradient coil 5 may be produced in a common production process such that they are non-releasably mechanically connected to one another and the intermediate space 14 forms. The intermediate space may be an air gap.

On the basis of the magnetic fields of the MRT system 1 that arise due to the different coils, as a consequence, in particular, of interactions, oscillations may occur within the MRT system 1. Herein, vibrations may be transmitted between the individual components of the MRT system and may impair an acoustic property of the MRT system 1. Between the gradient coil 5 and the body coil 4, waves may spread out so that sound propagation may take place here. It is propagated via the gradient coil 5 via the body coil 4 and from there in the direction of the patient 8, so that during an investigation by the MRT system 1, noise nuisance and, in particular, an impairment of the hearing capacity of the patient 8 may occur. In order to be able to minimize, in particular to hinder, this sound propagation, the intermediate space 14 may be specifically developed.

Figure 4:
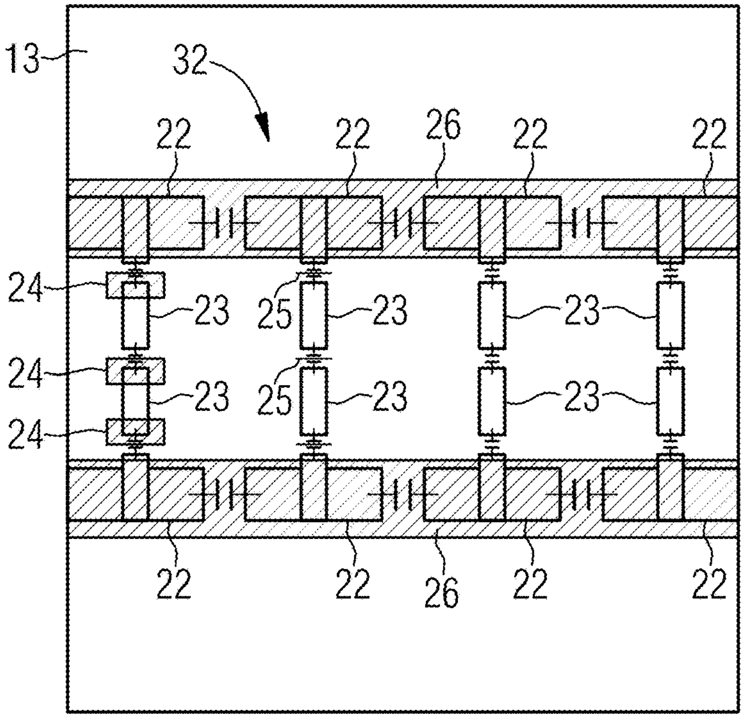
FIG. 4 depicts an example of a further schematic sectional view proceeding from FIG. 3, wherein here possibilities for better electrically insulating the body coil are shown.

For this purpose, in particular, at least one subregion 15 (compare FIG. 4) of the intermediate space 14 or the entire intermediate space 14 is evacuated. In other words, a vacuum may be formed and/or adjusted in the subregion 15 or in the intermediate space 14. This may minimize and, in particular, hinder sound propagation from the gradient coil 5 here to the body coil 4.

For the production of the vacuum, a vacuum pump unit 16 (see FIG. 1) may be provided. At least the subregion 14 may be evacuated therewith. Since the vacuum is to be maintained permanently, at least the vacuum pump unit 16 may be equipped with a corresponding control unit so that either the vacuum pump unit continuously provides that the vacuum prevails and, if the vacuum is lost and/or the pressure in the intermediate space 15 or in the subregion 14 rises again, restores a suitable negative pressure. For this purpose, at least one pressure sensor 17 or a plurality of pressure sensors 17 may be arranged and/or fastened in the subregion 14. Thus, the air pressure within the intermediate space 14 and, in particular, between the subregion 15 of the intermediate space 14 may be monitored and it may be ascertained accordingly whether a sufficient vacuum is present or not. Accordingly, dependent upon which measurement data and/or measurement values the pressure sensor 17 supplies, the vacuum pump unit 16 may be controlled automatically. Thus, a constant vacuum may be set within the subregion 15 of the intermediate space 14. So that the vacuum pump unit 16 is able to generate or adjust a suitable vacuum, at least the subregion 15 and, in particular, the intermediate space 14 may have openings 18, so that the vacuum pump unit 16 may be connected by pipes, hoses or other connecting elements to the intermediate space 14 in order to be able to generate a corresponding negative pressure.

In order to be able to maintain the vacuum, at least parts, regions, or other sites of the intermediate space 14, in particular, of the subregion 15 may be sealed by sealing elements such as sealing lips. These may be arranged at regions of the openings 18.

In order, in addition to the reduction of the sound propagation, to improve electrical properties of the arrangement 12 and thus of the MRT system 1, in order to screen electromagnetic fields such as HF fields, a special screening may be provided. Herein, a screening element 19 may be provided. This may be an HF screen. This may be applied and/or arranged on the gradient coil 5. The screening element 19 may be arranged on an inside 20 of the gradient coil 5. The screening element 19 is also configured cylindrical.

The inside 20 is arranged, in particular, oriented toward the gradient coil 4.

Herein, a plurality of possibilities exist as to how the screening element 19 is arranged on the gradient coil 5. Firstly, it may be arranged adjoining a surface and/or upper side of the inside 20. It is also conceivable that the screening element 20 is a component of the inside 20 and thus of the gradient coil 5 itself.

Figure 3:
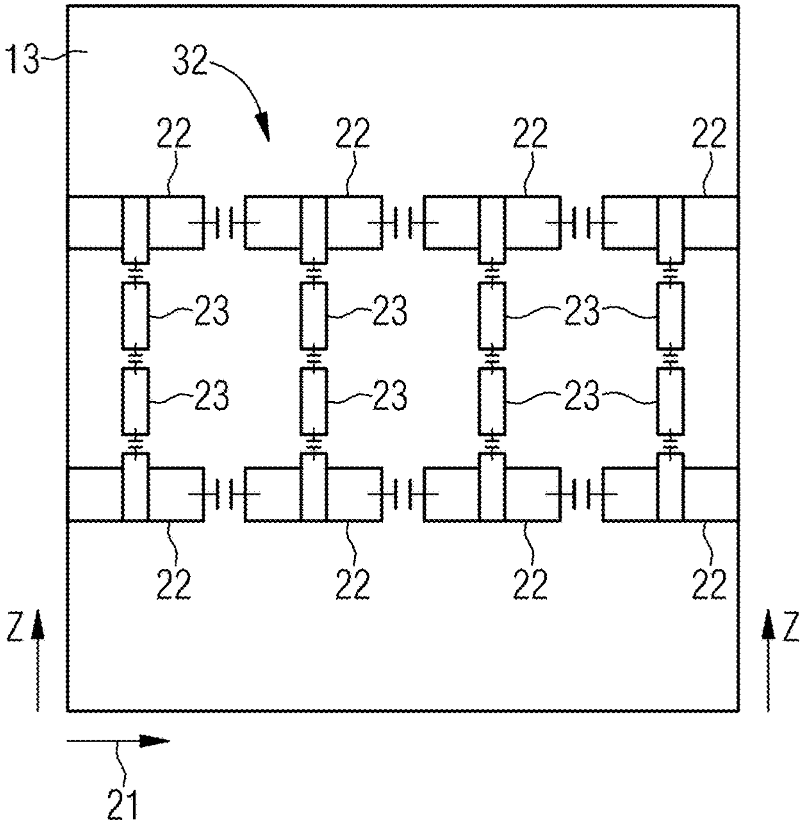
FIG. 3 depicts an example of a schematic sectional view of an unwound support tube and an unwound antenna element of the body coil of the MRT system of FIG. 1.

FIG. 3 shows a schematic representation of a section in the peripheral direction 21 and in the z-direction of the support element 13. In particular here, an unwound representation of the support element 13 and of an antenna element 22 is shown. The antenna element 22 may be the transmitting antenna of the body coil 4. Furthermore, it may be seen here that electrical components 23, (e.g., capacitors), are arranged between the coil levels in relation to the antenna element of the antenna element 22.

In order to be able to hinder electrical flash-overs or arcing between the gradient coil 5 and the body coil 4, the region between the body coil and the gradient coil 5 may additionally be insulated. Conceivable possibilities for this are shown in the subsequent FIG. 4.

In FIG. 4, again, the representation of FIG. 3 relating to the section and the unwound representation is shown.

Since, in this representation, the components 22, 23 are oriented toward the gradient coil 5, in particular, between these elements 22, 23, for example, flash-overs to the gradient coil 5 may occur. For this, the components 23 that may be electronic components such as capacitors, may be electrically insulated with a protective sleeve 24.

The protective sleeve 24 may be a protective cap. This may surround the respective electrical component 23 partially or completely, so that these components 23 are electrically insulated here. As represented by way of example in FIG. 4, the components 23 with protective sleeves 24 are at least partially surrounded in insulating manner and/or, seen from above, are covered over.

In a similar manner, this may also be undertaken and/or applied for components, such as capacitors, of the gradient coil 5. This is not shown here. Thus, the components and/or elements that are directed from the gradient coil 5 and/or are arranged oriented in the direction toward the body coil 4, which may also result in flash-overs, may also be electrically insulated by protective elements or protective sleeves.

A further possibility to be able to insulate the arrangement 12 better is the introduction of electrically insulated elements 25 such as insulating barriers. These may be applied where electrical terminals are present in relation to the components 23. In other words, in particular, such electrically insulating elements 25 are applied at solder points of corresponding electrical terminals of the components 23 so that no flash-overs may occur between the terminals for the components 23. These may also be arranged, in particular, at regions between such electrical terminals. In a similar manner, this may also be implemented for regions of electrical terminals of electrical components of the gradient coil 5, although this is not shown here.

A further point which may lead to voltage flash-overs, in particular to high voltage gradients is the antenna element 22 of the body coil 4. Flash-overs may occur at this transmitting element which may be configured, in particular, as a coil winding. For this purpose, the antenna element 22 may be enclosed at least partially, in particular completely, by an electrically insulating protective film 26. In order to be able to adapt this protective film 25 particularly advantageously to the structure and/or geometry of the antenna element 22, the protective film 26 may be configured as a shrink film. By a heat application, this shrink film may fit closely to the geometry and/or form of the antenna element 22. An efficient insulation is thus provided. In a similar manner, a protective film of this type may be applied accordingly to an antenna element of the gradient coil 5. This also is not shown here.

Figure 5:
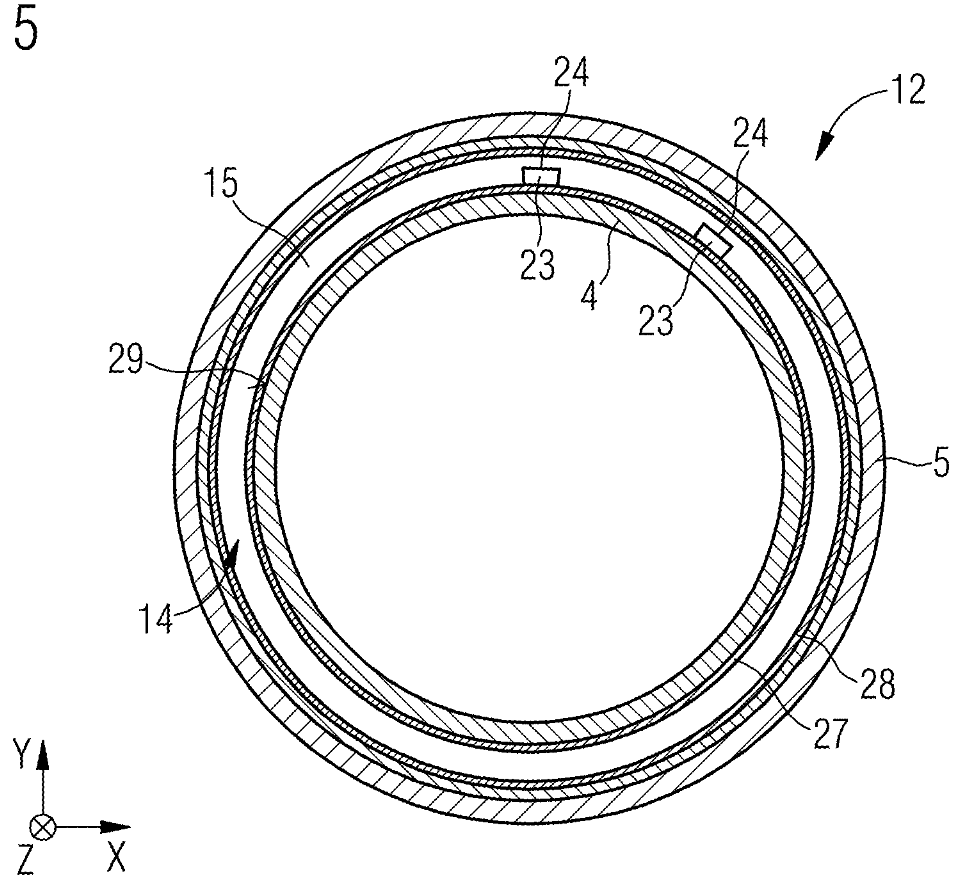
FIG. 5 depicts an example of a further schematic sectional view proceeding from FIG. 2, wherein here possibilities for better electrically insulating the body coil are shown.

FIG. 5 shows a representation of the arrangement 12 of FIG. 2 again. It is now described which embodiments may be present in order to be able to provide an additional electrical insulation with regard to the arrangement 12 and, in particular, for the coils 4, 5. In order to be able to insulate the body coil 4 and the components of the body coil 4 electrically relative to the gradient coil 5 and the components of the gradient coil 5 from one another and to hinder flash-overs between these two regions of the body coil 4 and the gradient coil 5, regions of the gradient coil 5 and/or of the body coil 4 may be specifically coated. Herein, electrically insulating coatings may be used. For example, a surface and/or circumferential area of an outside 29 of the carrier element 13 and thus of the body coil 4 may be coated with a special coating 27. This coating 27 has, in particular, an electrically insulating property. The outside 29 is oriented, in particular, toward the inside 20 of the gradient coil 4. By this, the coating 27, in particular as a coating layer, may cover the surface of the outside 29 partially, in regions or completely. Furthermore, on a surface and/or a circumferential area of the inside 20 of the gradient coil 5 also, a corresponding coating 28 and/or a coating layer may be applied and/or mounted. Thus, for example, as shown by way of example in FIG. 5, the coating layer and/or the coating 27, 28 may frame the intermediate space 15 and may thus provide a corresponding electrical insulation.

Figure 6:
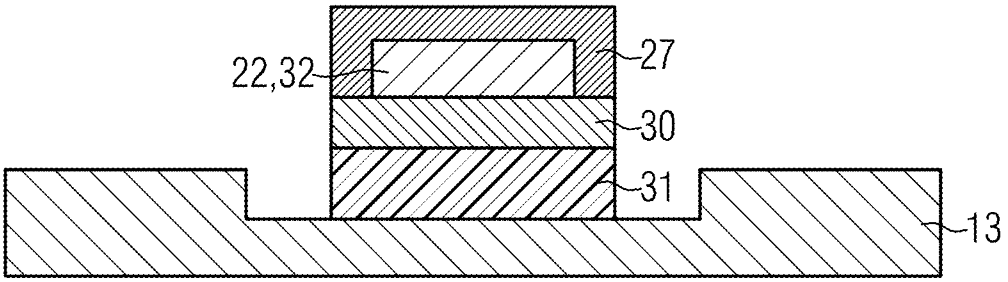
FIG. 6 depicts an example of a schematic view of a layered construction of the possibilities for being able to insulate the body coil electrically.

Shown in FIG. 6 is an exemplary sectional view wherein here in respect of the body coil 4 and/or the carrier element 13, the individual layers are shown with regard to the possibilities of the electrical insulation.

Firstly, the coating 27 is shown as the uppermost layer. This may also enclose the antenna element 22 and, in particular, an electrical conductor structure 32 (see FIG. 3) of the body coil 4. In order to prevent vibrations or other transferences as far as possible, it is advantageous if the conductor structure 32 such as the components 22, 23 are not directly, but rather indirectly, mechanically connected and/or fastened to the carrier element 13. For this purpose, the electrical conductor structure 32, which may include all the antenna elements, electronic elements, and other components of the body coil 4, are applied and/or fastened on a flexible carrier layer 30. This carrier layer 30 may be a flexible substrate which is produced, for example, from a composite material such as FR4 or PE. In order to achieve an acoustic decoupling, a plastics layer 31 may again be formed on a side, in particular an underside, of the carrier layer 30 that is oriented toward the carrier element 13. Also conceivable, in place of the plastics layer 31, is a rubber layer or a foam material layer or a soft plastics layer. Thus, the plastics layer 31 directly adjoins the carrier element 13 and thus the body coil 4 and consequently the further layer structure, as already described. Thus, an acoustic decoupling may be achieved so that sound propagation between the body coil and the gradient coil and in particular from the body coil toward the patient 8 may be kept as low as possible.

Furthermore, it is conceivable that an additional layer is arranged and/or applied between the body coil 4 and the gradient coil 5 in order further to minimize voltage flash-overs.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. An arrangement for a magnetic resonance system, the arrangement comprising:

a body coil;

a gradient coil; and a cylindrical carrier element on which the body coil is arranged, wherein the body coil and the gradient coil are arranged spaced from one another, wherein the body coil and the gradient coil are non-releasably mechanically connected to one another by one or more mechanical connecting points to form an intermediate space that extends between the body coil and the gradient coil, and wherein at least one subregion of the intermediate space is evacuated.

2. The arrangement of claim 1, further comprising:

at least one vacuum pump unit configured to evacuate the at least one subregion of the intermediate space, and wherein the at least one vacuum pump unit is configured to maintain a vacuum established in the at least one subregion.

3. The arrangement of claim 2, further comprising:

at least one pressure sensor arranged in the at least one subregion of the intermediate space, wherein the at least one vacuum pump unit is configured to be controlled based on measurement data from the at least one pressure sensor.

4. The arrangement of claim 2, wherein the at least one subregion comprises at least one opening by which the at least one vacuum pump unit is configured to be connected to the at least one subregion.

5. The arrangement of claim 1, wherein the at least one subregion is sealed by a sealing element.

6. The arrangement of claim 1, wherein an outside surface of the cylindrical carrier element oriented toward the gradient coil is coated at least partially with a coating comprising an electrically insulating property, and/or wherein an inside surface of the gradient coil oriented toward the body coil is coated at least partially with a coating comprising an electrically insulating property.

7. The arrangement of claim 1, wherein electrical components of the body coil arranged on the cylindrical carrier element are electrically insulated by protective sleeves, and/or wherein electrical components of the gradient coil are electrically insulated by protective sleeves.

8. The arrangement of claim 7, wherein regions between electric terminals of at least one electrical component of the electrical components of the body coil are equipped with electrically insulating elements, and/or wherein regions between electrical terminals of at least one electrical component of the electrical components of the gradient coil are equipped with electrically insulating elements.

9. The arrangement of claim 1, wherein at least one antenna element of the body coil is at least partially surrounded by an electrically insulating protective film, and/or wherein at least one antenna element of the gradient coil is at least partially surrounded by an electrically insulating protective film.

10. The arrangement of claim 9, wherein the electrically insulating protective film at least partially surrounding the at least one antenna element of the body coil is a shrink film, and/or wherein the electrically insulating protective film at least partially surrounding the at least one antenna element of the gradient coil is a shrink film.

11. The arrangement of claim 1, wherein a screening element is integrated in or arranged on an inside of the gradient coil oriented toward the body coil.

12. The arrangement of claim 11, wherein the screening element is cylindrically shaped.

13. The arrangement of claim 1, further comprising:

an additional layer arranged between the body coil and the gradient coil, wherein the additional layer is configured to prevent voltage flashovers between the body coil and the gradient coil.

14. The arrangement of claim 1, wherein electrical conductor structures of the body coil are indirectly fastened mechanically on the cylindrical carrier element.

15. The arrangement of claim 14, wherein the electrical conductor structures are mechanically fastened on a flexible carrier layer, and wherein the flexible carrier layer is fastened on the cylindrical carrier element.

16. The arrangement of claim 15, wherein the flexible carrier layer is made of a composite material, and wherein a plastics layer, a rubber layer, or a foam material layer is arranged on one side of the flexible carrier layer that is directly connected to the cylindrical carrier element.

17. The arrangement of claim 1, wherein the body coil and the gradient coil are configured to be produced in a common production process to provide the non-releasable mechanical connection to one another.

18. The arrangement of claim 1, wherein the at least one subregion comprises all subregions of the intermediate space such that an entirety of the intermediate space is evacuated.

19. A magnetic resonance system comprising:

an imaging modality; and an arrangement comprising:

a body coil;

a gradient coil; and a cylindrical carrier element on which the body coil is arranged, wherein the body coil and the gradient coil are arranged spaced from one another, wherein the body coil and the gradient coil are non-releasably mechanically connected to one another by one or more mechanical connecting points to form an intermediate space that extends between the body coil and the gradient coil, and wherein at least one subregion of the intermediate space is evacuated.

* * * * *